United States Patent
La Rosa

(10) Patent No.: US 9,460,761 B2
(45) Date of Patent: Oct. 4, 2016

(54) LOWER POWER SENSE AMPLIFIER FOR READING NON-VOLATILE MEMORY CELLS

(71) Applicant: STMICROELECTRONICS (ROUSSET) SAS, Rousset (FR)

(72) Inventor: Francesco La Rosa, Rousset (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 14/751,701

(22) Filed: Jun. 26, 2015

(65) Prior Publication Data

US 2016/0049179 A1    Feb. 18, 2016

(30) Foreign Application Priority Data

Aug. 14, 2014 (FR) ..................... 14 57824

(51) Int. Cl.

| | | |
|---|---|---|
| G11C 11/34 | (2006.01) | |
| G11C 7/00 | (2006.01) | |
| G11C 7/02 | (2006.01) | |
| G11C 5/14 | (2006.01) | |
| G11C 7/06 | (2006.01) | |
| G11C 7/08 | (2006.01) | |

(52) U.S. Cl.
CPC ........ G11C 7/065 (2013.01); G11C 7/08 (2013.01)

(58) Field of Classification Search
USPC ........... 365/203, 205, 207, 208, 226, 185.11, 365/185.21; 327/51, 57
See application file for complete search history.

(56) References Cited

U.S. PATENT DOCUMENTS

| | | | | |
|---|---|---|---|---|
| 4,169,233 A | * | 9/1979 | Haraszti ................ | G11C 5/005 365/205 |
| 4,694,205 A | * | 9/1987 | Shu ..................... | G11C 11/4094 365/205 |
| 5,243,573 A | | 9/1993 | Makihara et al. | |
| 5,526,314 A | * | 6/1996 | Kumar ................. | G11C 7/065 365/205 |
| 5,604,705 A | * | 2/1997 | Ackland .............. | G11C 11/419 365/205 |
| 7,372,746 B2 | * | 5/2008 | Kim ..................... | G11C 7/08 365/205 |
| 8,305,815 B2 | * | 11/2012 | La Rosa .............. | G11C 7/12 365/205 |
| 8,363,499 B2 | | 1/2013 | La Rosa | |
| 8,467,251 B2 | * | 6/2013 | La Rosa .............. | G11C 7/12 365/205 |
| 8,792,293 B2 | * | 7/2014 | Singh .................. | G11C 11/4091 365/205 |
| 9,013,940 B2 | * | 4/2015 | Katoch ................ | G11C 11/419 365/205 |
| 2008/0175073 A1 | | 7/2008 | Seo | |
| 2010/0073999 A1 | | 3/2010 | Kitai et al. | |

* cited by examiner

Primary Examiner — Trong Phan
(74) Attorney, Agent, or Firm — Seed IP Law Group PLLC

(57) ABSTRACT

A sense amplifier includes: two detection inputs, a latch circuit including two sections coupled to each other and each supplying a data signal. Each section is respectively powered by a P-channel control transistor, having a gate terminal receiving a control signal linked to a respective detection input of the two detection inputs. The sense amplifier includes a control circuit configured to reduce each of the control signals to a sufficiently low voltage to put the corresponding control transistor to the on state, when the control signal reaches a reference voltage. The latch circuit is activated to supply one of the data signals when a corresponding one of the control transistors is in the on state.

25 Claims, 8 Drawing Sheets

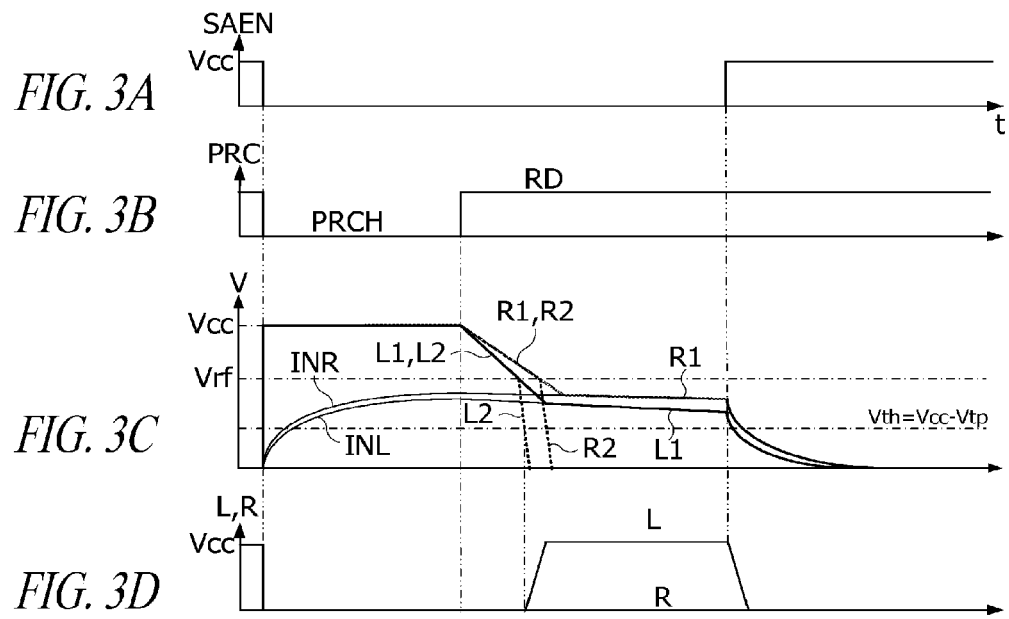
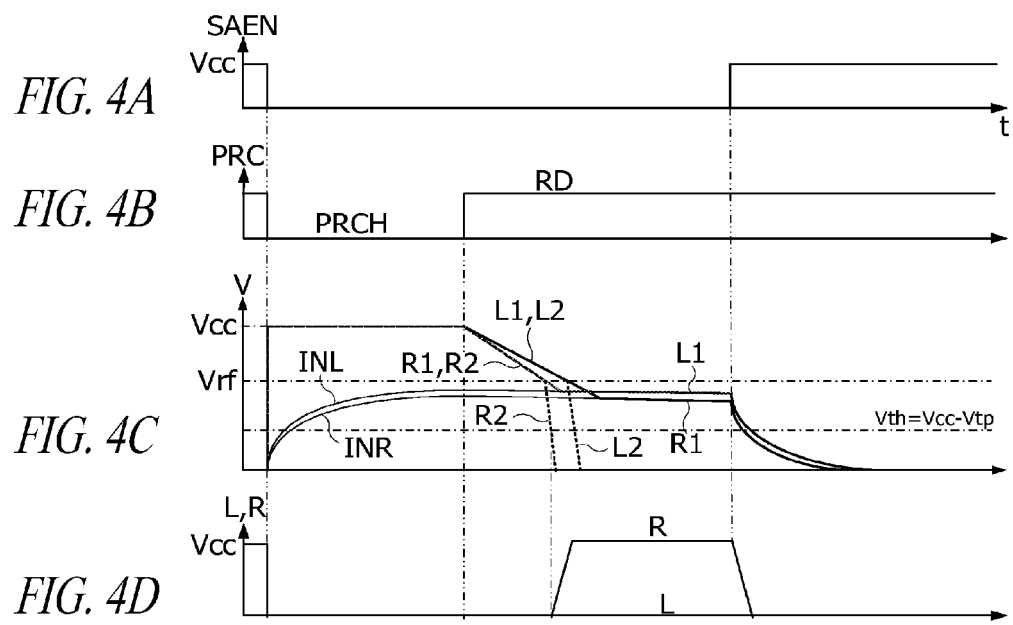

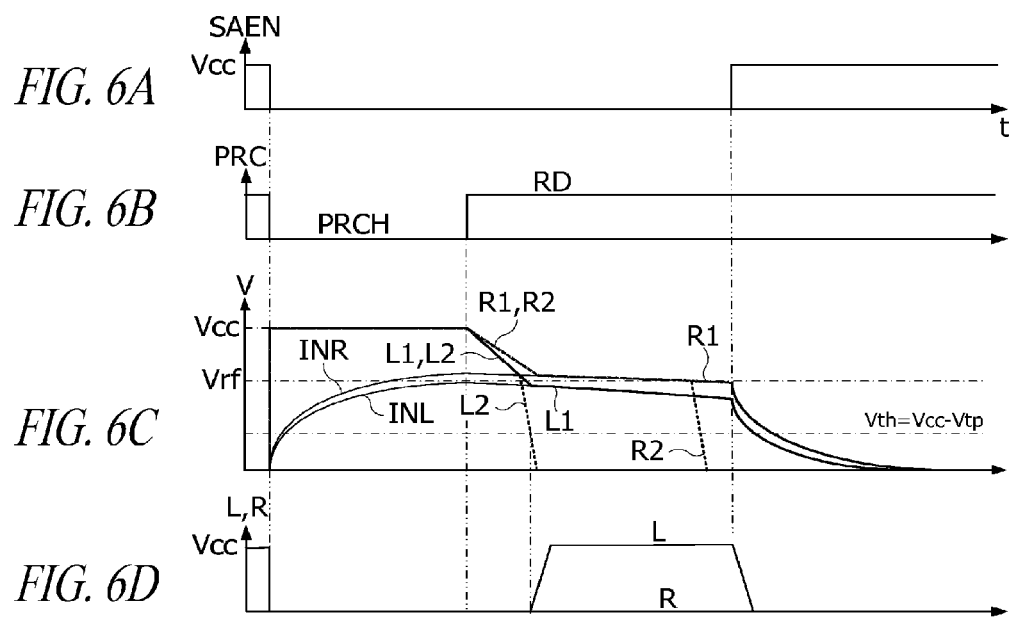
FIG. 6A
FIG. 6B
FIG. 6C
FIG. 6D
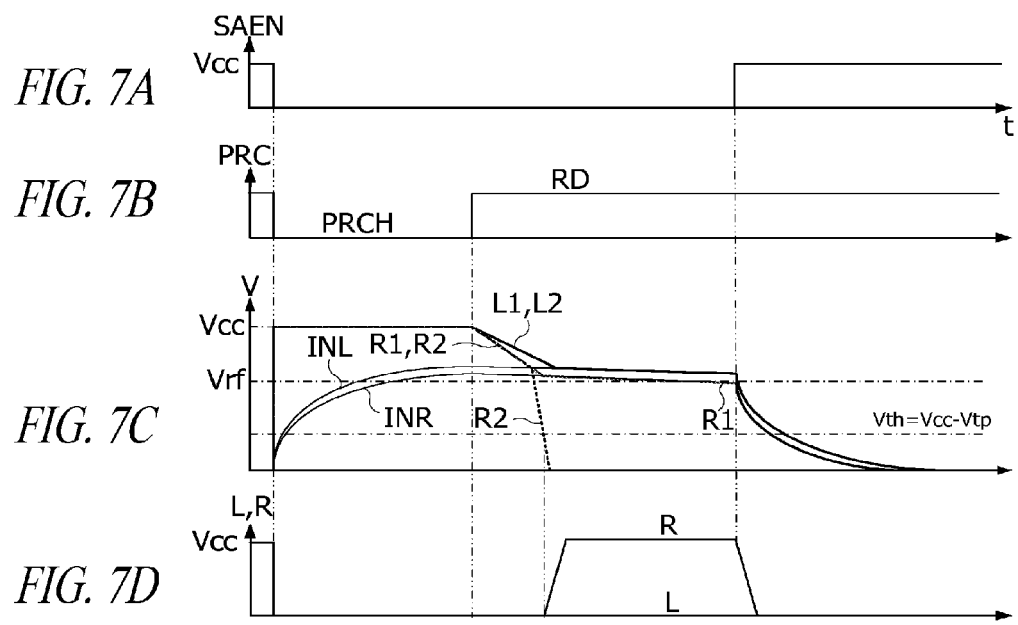
FIG. 7A
FIG. 7B
FIG. 7C
FIG. 7D

LOWER POWER SENSE AMPLIFIER FOR READING NON-VOLATILE MEMORY CELLS

BACKGROUND

1. Technical Field

The present disclosure relates to non-volatile memories and more particularly to a sense amplifier for reading non-volatile memory cells.

2. Description of the Related Art

Sense amplifiers are conventionally used to detect a conductivity state of non-volatile memory cells, which may generally be a high-conductivity state or a low-conductivity state, and to supply a data signal which depends on the state of the memory cell. For example, the cells of electrically erasable and programmable memories may be in a programmed state or in an erased state which correspond to two different conductivities.

Sense amplifiers may be asymmetric or differential. Asymmetric sense amplifiers have an internal current source or a voltage source to detect, via a single detection input, the state of a memory cell. Differential sense amplifiers have two detection inputs. FIG. 1 represents an example of a conventional differential sense amplifier SA1, of the type described in U.S. Pat. No. 8,363,499. The sense amplifier SA1 has a first detection input SI1 and a second detection input SI2. The first detection input SI1 is coupled to a memory cell MC through a bit line BL1. The second detection input SI2 is connected to a reference line BL2 coupled to a current source CS1 or to any other reference element such as a reference resistor.

The sense amplifier SA1 comprises a latch circuit LT1 comprising two inverter gates mounted head-to-tail IG1, IG2. One output of the gate IG1 and one input of the gate IG2 are connected to a first output node O1, and one output of the gate IG2 and one input of the gate IG1 are connected to a second output node O2. The node O1 supplies a logic data signal L and the node O2 supplies a logic data signal R. The inverter gate IG1 is powered by an enabling signal ENA through a first P-channel control transistor P3. The inverter gate IG2 is powered by the enabling signal ENA through a second P-channel control transistor P4. The enabling signal ENA is taken to a voltage Vcc (ENA=1) to enable the latch circuit LT1 and is put to the ground (ENA=0) to disable the latch circuit. The gate terminal (G) of the transistor P3 forms a first control input L2 of the latch circuit LT1 and is coupled to the first detection input SI1 of the sense amplifier SA1. The gate terminal (G) of the transistor P4 forms a second control input of the latch circuit and is coupled to the second detection input SI2 of the sense amplifier SA1.

The inverter gate IG1 comprises for example a P-channel transistor P1 and an N-channel transistor N1 having their drain terminals (D) connected to the output node O1 and their gate terminals (G) connected to the output node O2. The source terminal (S) of the transistor N1 is connected to the ground and the source terminal (S) of the transistor P1 is connected to the drain terminal (D) of the control transistor P3. Similarly, the inverter gate IG2 comprises a P-channel transistor P2 and an N-channel transistor N2 having their drain terminals (D) connected to the output node O2 and their gate terminals (G) connected to the output node O1. The source terminal (S) of the transistor N2 is connected to the ground and the source terminal (S) of the transistor P2 is connected to the drain terminal (D) of the control transistor P4.

The first control input L2 is coupled to the first detection input SI1 through an N-channel cascode transistor N5 and the second control input R2 of the latch circuit LT1 is coupled to the second detection input SI2 by an N-channel cascode transistor N6. The cascode transistors N5, N6 are controlled by a signal CLSC applied to their gate terminals (G). The sense amplifier SA1 further comprises P-channel precharge transistors P5, P6. Each precharge transistor P5, P6 has its drain terminal (D) connected to a control input of the latch circuit, respectively L2, R2, and receives the supply voltage Vcc on its source terminal (S), and a precharge signal PRE on its gate terminal (G). The sense amplifier SA1 also comprises a latch circuit CLC1. The latch circuit CLC1 comprises two N-channel transistors N7, N8. Each transistor N7, N8 has its drain terminal (D) connected to one of the detection inputs SI1, SI2 respectively, its source terminal (S) connected to the ground, and receives a latching signal CLP on its gate terminal (G). The latching signal CLP is supplied by an OR gate G1 which receives at input the first and second data signals L, R. Thus the latching signal CLP is automatically enabled when one of the first and second data signals L, R increases and reaches a threshold voltage.

The reading of the memory cell MC comprises a precharge phase and a reading phase. During the precharge phase, the two detection inputs SI1, SI2 are taken to a precharge voltage by means of the transistors P5, P6 and through the cascode transistors N5, N6. The voltage Vcc is applied to the source terminals (S) of the control transistors P3, P4 of the latch circuit LT1.

Once a precharge voltage has been reached on the bit line BL1 and on the reference line BL2, the precharge signal PRC is pulled up and the reading of the memory cell MC begins. The bit line BL1 and the reference line BL2 begin to discharge. The voltages INL, INR respectively present on the first and second detection inputs SI1, SI2 begin to decrease at different speeds, creating a voltage difference which depends on whether the memory cell is in the high- or low-conductivity state. If the memory cell MC is in the high-conductivity state, the voltage present on the bit line BL1 drops more rapidly than the voltage on the reference line BL2. If the memory cell is in the low-conductivity state, the voltage present on the bit line BL1 drops more slowly than the voltage on the reference line BL2. The voltage difference between the bit line BL1 and the reference line BL2 is amplified by the cascode transistors N5, N6 and supplied between the gate terminals of the control transistors P3, P4. The result is that the control transistor P3, P4 corresponding to the bit BL1 or reference BL2 line the voltage of which drops most rapidly becomes on, whereas the other control transistor remains off. The latch LT1 thus switches to one of its two possible states, and the sense amplifier SA1 supplies a data signal L=0 or L=1 corresponding to the conductivity state of the memory cell MC. The switch of the latch LT1 also has the effect of enabling the latching signal CLP, which renders the transistors N7, N8 on, and thus initializes the voltages on the bit line BL1 and the reference line BL2.

It transpires that this sense amplifier architecture does not support low supply voltages such as those available in low-voltage devices, powered by a battery or by a near field communication (NFC) interface circuit generating a supply voltage from a signal transmitted by inductive coupling and charge modulation.

It is thus desirable to propose a sense amplifier capable of functioning on a wide range of supply voltages, having a good immunity to noise, and a low current consumption. It is also desirable to propose a sense amplifier that rapidly and accurately reads a memory cell, particularly of a non-volatile memory.

BRIEF SUMMARY

Some embodiments relate to a sense amplifier comprising: a first and a second detection input, a latch circuit comprising a first section supplying a first data signal and a second section coupled to the first section and supplying a second data signal, a first P-channel control transistor, arranged for electrically supplying the first section, and having a gate terminal receiving a first control signal linked to the first detection input, a second P-channel control transistor, arranged for electrically supplying the second section, and having a gate terminal receiving a second control signal linked to the second detection input, a first control circuit configured to reduce the first control signal to a sufficiently low voltage to put the first control transistor to an on state, when the first control signal reaches a first reference voltage, and a second control circuit configured to reduce the second control signal to a sufficiently low voltage to put the second control transistor to the on state, when the second control signal reaches a second reference voltage, the latch circuit being activated to supply a data signal when one of the control transistors is in the on state.

According to one embodiment, the first section of the latch circuit comprises at least one first inverter gate, and the second section of the latch circuit comprises at least one second inverter gate, the first and second inverter gates being mounted head-to-tail.

According to one embodiment, the sense amplifier comprises a first cascode transistor arranged between the first detection input and the first control circuit, and a second cascode transistor arranged between the second detection input and the second control circuit.

According to one embodiment, the first control circuit is arranged for reducing the voltage of the first control signal when it is lower than the highest voltage among the reference voltage and the voltage of the second detection input, and the second control circuit is arranged for reducing the voltage of the second control signal when it is lower than the highest voltage among the reference voltage and the voltage of the first detection input.

According to one embodiment, the sense amplifier comprises a precharge circuit for taking to a first voltage the gate terminals of the first and second control transistors, and the first and second control circuits, and for taking to a second voltage the first and second detection inputs.

According to one embodiment, the sense amplifier comprises an initialization circuit for initializing the latch circuit.

According to one embodiment, a conduction terminal of each of the first and second control transistors receives an enabling signal that is active during precharge and reading phases, and inactive from the end of the reading phase.

Some embodiments also relate to a memory device comprising memory cells connected to bit lines and at least one sense amplifier as defined above, a detection input of the sense amplifier being connected to at least one of the bit lines.

According to one embodiment, the memory device comprises a first and a second memory array, the first detection input of the sense amplifier being coupled to bit lines of the first memory array, and the second detection input of the sense amplifier being coupled to bit lines of the second memory array.

According to one embodiment, the sense amplifier comprises a first current source associated with a first switch to couple the first current source to the first detection input when the second detection input is coupled to a memory cell to be read of the second memory array, and a second current source associated with a second switch to couple the second current source to the second detection input when the first detection input is coupled to a memory cell to be read of the first memory array.

Some embodiments also relate to an integrated circuit on a semiconductor chip, comprising a memory device as defined above.

Some embodiments also relate to a portable device comprising such an integrated circuit.

Some embodiments also relate to a method for reading a memory cell, comprising steps of: electrically supplying a first section of a latch circuit through a first P-channel control transistor, electrically supplying a second section of the latch circuit through a second P-channel control transistor, coupling a first detection input to a bit line to which a memory cell to be read is connected, coupling a second detection input to a reference line, reducing a first control signal of the first control transistor to a sufficiently low voltage to put the first control transistor to the on state, when the first control signal reaches a first reference voltage, the first control signal being linked to the first detection input, reducing a second control signal of the second control transistor to a sufficiently low voltage to put the second control transistor to the on state, when the second control signal reaches a second reference voltage, the second control signal being linked to the second detection input, and supplying a first data signal by means of the first section of the latch circuit and a second data signal by means of the second section of the latch circuit, when the first or the second control transistor is in the on state.

According to one embodiment, the first control signal is reduced to a sufficiently low voltage to put the first control transistor to the on state, when the first control signal reaches the highest voltage among the first reference voltage and the voltage of the second detection input, and the second control signal is reduced to a sufficiently low voltage to put the second control transistor to the on state, when the second control signal reaches the highest voltage among the second reference voltage and the voltage of the first detection input.

According to one embodiment, the method comprises a precharging step for taking to a first voltage the gate terminals of the first and second control transistors, and for taking to a second voltage the first and second detection inputs.

BRIEF DESCRIPTION OF THE SEVERAL VIEWS OF THE DRAWINGS

Some examples of embodiments of the present disclosure will be described below in relation with, but not limited to, the accompanying figures, in which:

FIGS. 3A, 3B, 3C, 3D represent curves of voltage variations over time, showing the operation of the amplifier in FIG. 2;

FIGS. 4A, 4B, 4C, 4D represent curves of voltage variations over time, showing the operation of the amplifier in FIG. 2;

FIGS. 6A, 6B, 6C, 6D represent curves of voltage variations over time, showing the operation of the amplifier in FIG. 5;

FIGS. 7A, 7B, 7C, 7D represent curves of voltage variations over time, showing the operation of the amplifier in FIG. 5;

DETAILED DESCRIPTION

Figure 1:
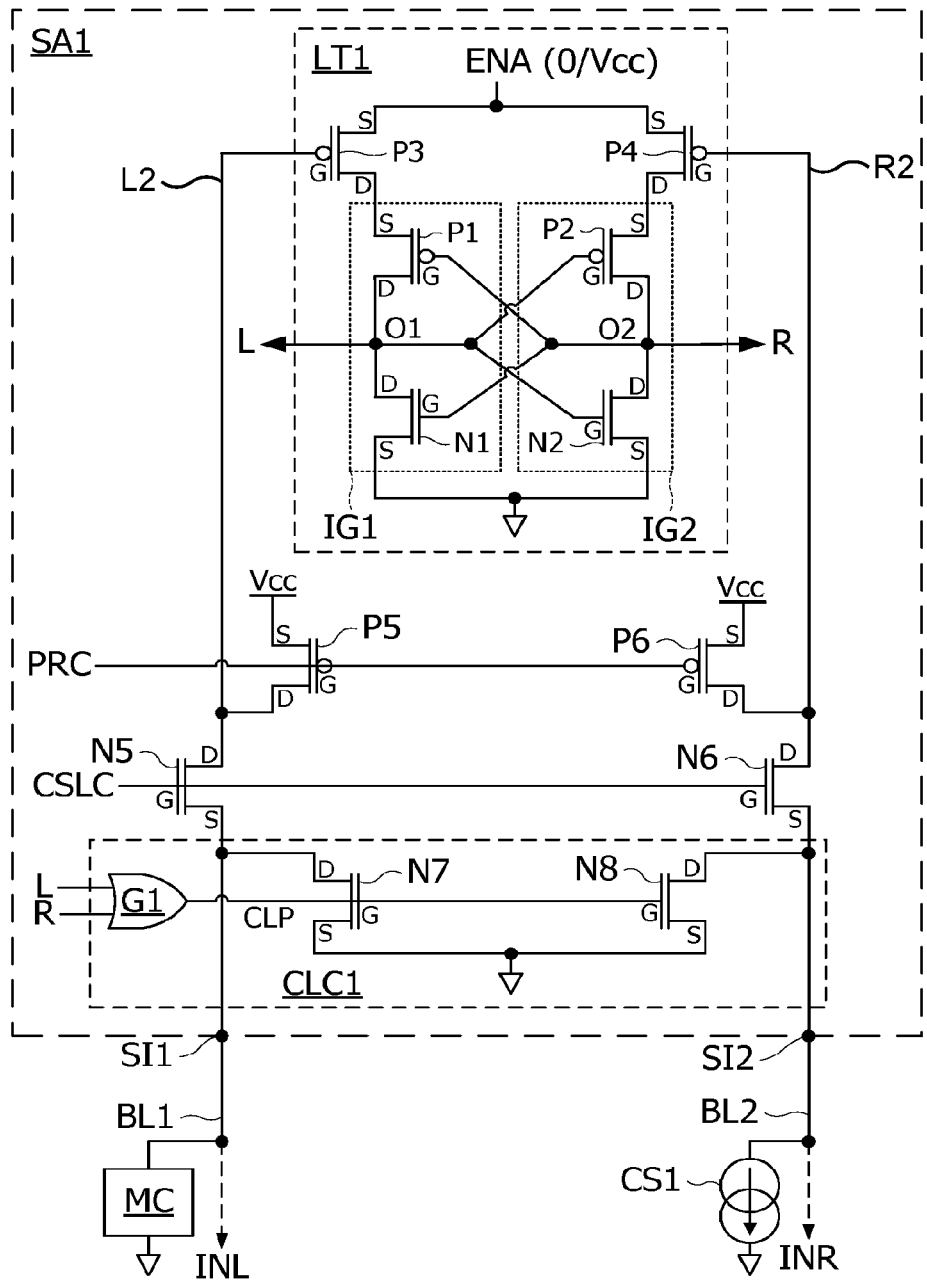
FIG. 1 described above schematically represents a conventional differential sense amplifier.
Figure 2:
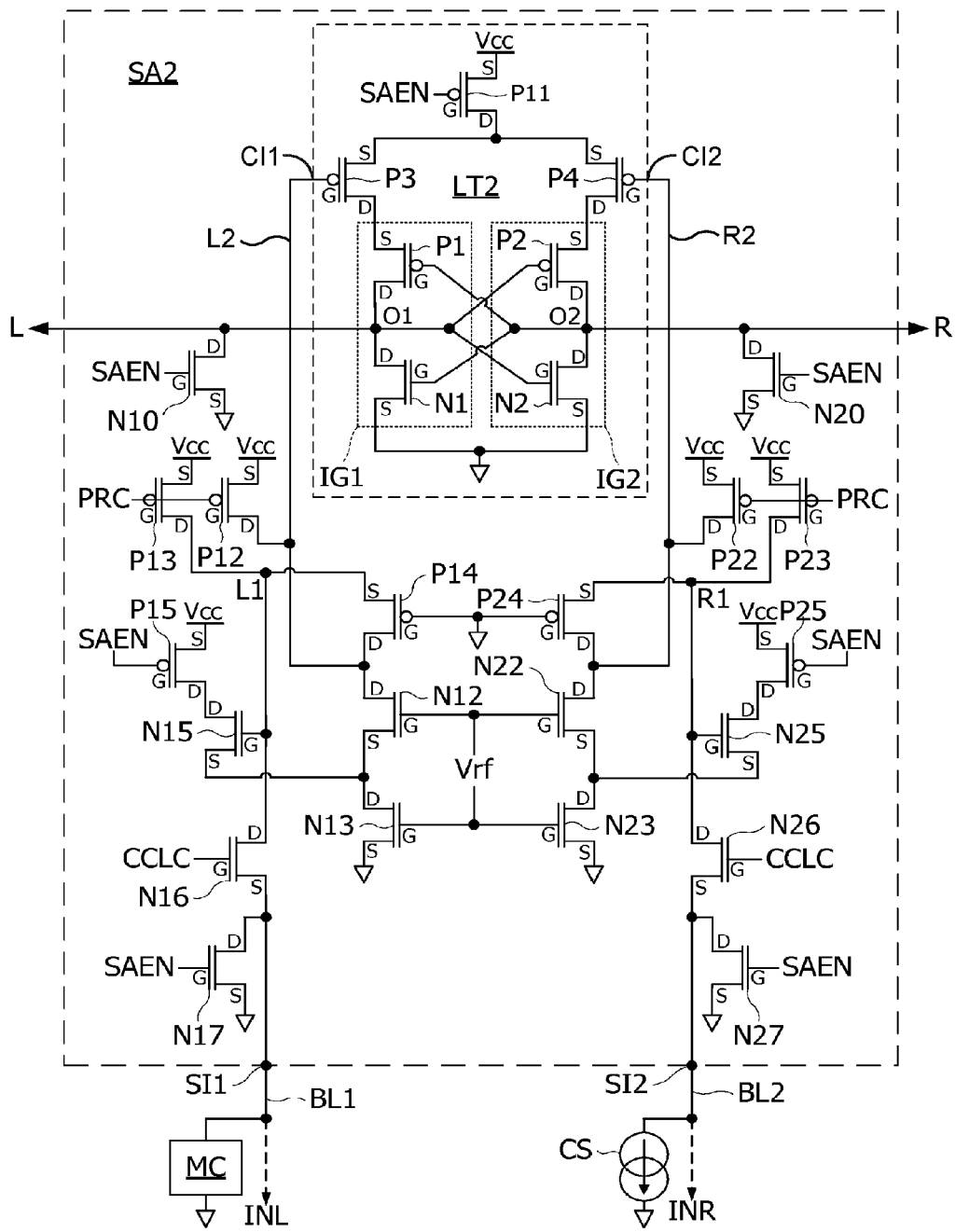
FIG. 2 schematically represents a differential sense amplifier, according to one embodiment.

A sense amplifier SA2 according to one embodiment is represented in FIG. 2. The sense amplifier SA2 has a first detection input SI1 and a second detection input SI2. The first detection input SI1 is provided for being coupled for example to a memory cell MC through a bit line BL1. The second detection input SI2 is provided for being connected to a current source CS, through the reference line BL2, or to any other reference element such as a reference resistor. Alternatively, the second detection input 512 can be coupled to a memory cell through a bit line, and the first detection input SI1 can be coupled to a reference line coupled to a current source or another reference element.

The sense amplifier SA2 comprises a latch circuit LT2 comprising a first section IG1, a second section IG2 coupled to the first section IG1, a first output node O1 and a second output node O2. The first section IG1 has an output connected to the output node O1 and supplies a logic data signal L. The second section IG2 has an output connected to the output node O2 and supplies a logic data signal R. The section IG1 is powered by a supply voltage Vcc through a P-channel control transistor P3. The section IG2 receives the supply voltage through a P-channel control transistor P4. The supply voltage Vcc is transmitted to the control transistors P3, P4 by a P-channel transistor P11 the gate terminal of which is controlled by an enabling signal SAEN for enabling the sense amplifier SA2. The gate terminal (G) of the transistor P3 forms a first control input CI1 of the latch circuit LT2. The gate terminal (G) of the transistor P4 forms a second control input CI2 of the latch circuit.

In the embodiment shown in FIG. 2, the first control input CI1 of the latch circuit LT2 is coupled to the first detection input SI1 through a P-channel transistor P14 and an N-channel cascode transistor N16. The second control input CI2 of the latch circuit LT2 is coupled to the second detection input 512 through a P-channel transistor P24 and an N-channel cascode transistor N26. The transistors P14, P24 have their gate terminals (G) connected to the ground. The cascode transistors N16, N26 are controlled by a signal CCLC applied to their gate terminals (G), the signal CCLC having a voltage that is adjusted so that the transistors N16, N26 supply the bit BL1 and reference BL2 lines with a maximum voltage suited to the reading of a memory cell, for example 0.7V.

The first and second sections IG1, IG2 are for example inverter gates mounted head-to-tail, the input of the gate IG1 being connected to the output of the gate IG2 and vice-versa. The inverter gate IG1 comprises for example a P-channel transistor P1 and an N-channel transistor N1 having their drain terminals (D) connected to the output node O1 and their gate terminals (G) connected to the output node O2.

The source terminal (S) of the transistor N1 is connected to the ground and the source terminal (S) of the transistor P1 is connected to the drain terminal (D) of the control transistor P3 the source terminal (S) of which is connected to the drain of the transistor P11. Similarly, the inverter gate IG2 comprises for example a P-channel transistor P2 and an N-channel transistor N2 having their drain terminals (D) connected to the output node O2 and their gate terminals (G) connected to the output node O1. The source terminal (S) of the transistor N2 is connected to the ground and the source terminal (S) of the transistor P2 is connected to the drain terminal (D) of the control transistor P4 the source terminal (S) of which is connected to the drain of the transistor P11. The outputs O1 and O2 respectively supply output signals L and R.

The control input CI1 also receives the supply voltage Vcc through a P-channel transistor P12 controlled by a precharge signal PRC supplied on its gate terminal (G). The source terminal (S) of the transistor P12 receives the supply voltage Vcc, and the drain terminal (D) of the transistor P12 is connected to the control input CI1. Similarly, the control input CI2 also receives the supply voltage Vcc through a P-channel transistor P22 controlled by the precharge signal PRC supplied on its gate terminal (G). The source terminal (S) of the transistor P22 receives the supply voltage Vcc, and the drain terminal (D) of the transistor P22 is connected to the control input CI2.

The source terminal (S) of the transistor P14 receives a control signal L1 supplied by the drain terminal (D) of a P-channel transistor P13 controlled by the signal PRC supplied on its gate (G). The source terminal (S) of the transistor P13 receives the supply voltage Vcc. Similarly, the source terminal (S) of the transistor P24 receives a control signal R1 supplied by a P-channel transistor P23 controlled by the signal PRC supplied on its gate (G). The source terminal (S) of the transistor P23 receives the supply voltage Vcc. The control signal L1 is transmitted by the cascode transistor N16 to the first detection input SI1, and the control signal R1 is transmitted by the cascode transistor N26 to the second detection input SI2.

The drain terminal (D) of the transistor P14 supplies a control signal L2 and is connected to the control input CI1 and to the drain terminal (D) of an N-channel transistor N12. Similarly, the drain terminal (D) of the transistor P24 supplies a control signal R2 and is connected to the control input C12 and to the drain terminal (D) of an N-channel transistor N22. The gate terminals (G) of the transistors N12, N22 receive the reference voltage Vrf. The source terminal (S) of the transistor N12 is connected to the drain terminal (D) of an N-channel transistor N13 the source terminal (S) of which is connected to the ground and the gate terminal (G) of which receives a reference voltage such as the voltage Vrf. Similarly, the source terminal (S) of the transistor N22 is connected to the drain terminal (D) of an N-channel transistor N23 the source terminal (S) of which is connected to the ground and the gate terminal (G) of which receives a reference voltage such as the voltage Vrf. The source terminal (S) of the transistor N12 and the drain terminal (D) of the transistor N13 are also connected to the source terminal (S) of an N-channel transistor N15 the gate terminal (G) of which receives the control signal L1 and the drain terminal (D) of which is connected to the drain terminal of a P-channel transistor P15. The gate terminal (G) of the transistor P15 receives the signal SAEN and the source terminal (S) receives the supply voltage Vcc. Similarly, the source terminal (S) of the transistor N22 and the drain terminal (D) of the transistor N23 are also connected to the source terminal (S) of an N-channel transistor N25 the gate terminal (G) of which receives the control signal L2 and the drain terminal (D) of which is connected to the drain terminal of a P-channel transistor P25. The gate terminal (G) of the transistor P25 receives the signal SAEN and the source terminal (S) receives the supply voltage Vcc.

The sense amplifier SA2 also comprises N-channel transistors N10, N20, N17, N27 whereby it is possible to reset the sense amplifier at the end of a reading phase. The transistors N10, N20 enable the latch circuit LT2 to be reset. For this purpose, the drain terminal (D) of the transistor N10 is connected to the output O1 and the drain terminal (D) of the transistor N20 is connected to the output O2. The transistors N10, N20 have their source terminals (S) grounded and their gate terminals receive the enabling signal SAEN. The transistors N17, N27 enable the bit line BL1 and the reference line BL2 to be discharged. The transistors N17, N27 receive the enabling signal SAEN on their gate terminals (G). The transistors N17, N27 have their drain terminals (D) respectively connected to the detection inputs SI1, SI2, and their source terminals (S) connected to the ground.

The operation of the sense amplifier SA2 will now be described. FIGS. 3A to 3D show different signals and different voltages in the sense amplifier SA2 during precharge PRCH and reading RD phases, when the memory cell MC is in a high-conductivity state (for example an erased state). FIGS. 4A to 4D show the same signals and the same voltages in the sense amplifier SA2 during the same precharge and reading phases, when the memory cell MC is in a low-conductivity state (for example a programmed state).

More particularly, FIGS. 3A, 4A show the shape of the read-enabling signal SAEN. FIGS. 3B, 4B show the shape of the precharge signal PRC. FIGS. 3C, 4C show the shape of the signals INL, INR in the bit lines BL1 and BL2, of the control signals L2, R2 present on the control inputs CI1, CI2 of the circuit LT2, and of the control signals L1 and R1. FIGS. 3D, 4D show the shape of the data signals L and R supplied by the output nodes O1 and O2 of the circuit LT2.

As previously indicated, the second detection input SI2 is coupled to the current source CS through the reference line BL2. It is assumed that the current source CS draws a constant current the value of which is set between the current passing through a memory cell in the high-conductivity state and the current passing through a memory cell in the low-conductivity state.

The precharge phase begins when the signal PRC is set to zero (FIGS. 3B, 4B), the read-enabling signal SAEN also being set to zero. The result is that the P-channel transistors P11, P12, P13, P15, P22, P23 and P25 become on, and the N-channel transistors N10, N17, N20 and N27 are off. The control signals L1, L2, R1 and R2 thus reach the supply voltage Vcc (FIGS. 3C, 4C). The cascode signal CCLC is applied to the gate of the transistors N16, N26. The result is that the output voltages INL, INR applied to the bit lines BL1 and BL2 begin to increase (FIGS. 3C, 4C) until they reach a maximum precharge voltage approximately equal to CCLC−Vgs, Vgs being the gate-source voltage of the transistors N16, N26.

As the enabling signal SAEN has previously been put to Vcc, the latch circuit LT2 is disabled and its output nodes O1, O2 are in the state HZ (high impedance) after being put to zero. As a result, on FIGS. 3D, 4D, the data signals L, R are shown as being equal to zero during the precharge phase PRCH.

The sense amplifier SA2 enters the reading phase RD when the precharge signal PRC changes back to Vcc (FIG. 3B) to disable the transistors P12, P13, P22, P23. As they are no longer being charged, the bit line BL1 and the reference line BL2 begin to discharge (FIGS. 3C, 4C). The voltages INL, INL begin to decrease from the voltage CCLC−Vgs. The control voltages L2, R2, L1 and R1 also begin to decrease from the voltage Vcc (FIGS. 3C, 4C). It shall be noted that the decrease over time of the voltage of the signals L1, L2, R1, R2 is here linear with the shape $\Delta V = I/C \cdot \Delta t$, $\Delta V$ representing a voltage variation corresponding to the time interval $\Delta t$, I representing the intensity of the corresponding current, and C the stray capacitances of the circuit.

If the memory cell MC is in a high-conductivity state, the current passing through the memory cell is higher than the reference current drawn by the current source CS. As a result, the bit line BL1 discharges more rapidly than the reference line BL2 and, as shown in FIG. 3C, the voltages of the signals L1, L2 decrease more rapidly than the voltages of the signals R1, R2.

If the memory cell MC is in a low-conductivity state, the current passing through the memory cell is lower than the reference current drawn by the current source CS. As a result, the reference line BL2 discharges more rapidly than the bit line BL1 and, as shown in FIG. 4C, the voltages of the signals R1, R2 decrease more rapidly than the voltages of the signals L1, L2.

As the transistors N16 and N26 are on, the signals L1, R1 respectively follow the signals INL, INR present on the bit line BL1 and the reference line BL2. The signals L2, R2 respectively follow the signals L1, R1 while the transistors P14, P24 are on. The transistors N12 and N15 compare the voltage of the signal L1 (on the gate of the transistor N15) with the voltage Vrf on the gate of the transistor N12. The transistor N12 or N15 that has the gate at the highest voltage conducts the entire current. While the signal L1 has a higher voltage than the voltage Vrf, the transistor N15 is on and the transistor N12 is off. Similarly, the transistors N22 and N25 compare the voltage of the signal R1 (on the gate of the transistor N25) with the voltage Vrf on the gate of the transistor N22. The transistor N22 or N25 that has the gate at the highest voltage conducts the entire current. While the signal R1 has a higher voltage than the voltage Vrf, the transistor N25 is on and the transistor N22 is off. When one of the control signals L1, R1 reaches the reference voltage Vrf first (the signal L1 on FIG. 3C and the signal R1 on FIG. 4C), the corresponding transistor P14, P24 becomes off and the corresponding transistor N12, N22 becomes on. As soon as the voltage of the signal L1 becomes lower than the voltage Vrf, the transistor N15 becomes off and the transistor N12 becomes on. The voltage of the signal L2 is thus pulled to the ground. Similarly, as soon as the voltage of the signal R1 becomes lower than the voltage Vrf, the transistor N25 becomes off and the transistor N22 becomes on. The voltage of the signal R2 is thus also pulled to the ground. The transistors N12 and N15 on the one hand, and the transistors N22 and N25 on the other hand, behave like a voltage comparison stage and a current switch which directs the entire current to the transistor having the highest gate voltage. These arrangements enable the control lines CI1, CI2 to continue being discharged, i.e., the signals L2, R2 to be decreased, when the voltage of the corresponding signal L1, R1 is too low (lower than the voltage Vrf). The transistor P3 or P4 switches on when the control signal L2 on FIG. 3C, and R2 on FIG. 4C reaches a threshold voltage Vth (Vth=Vcc−Vtp, Vtp being the threshold voltage of the P-channel transistor P3 or P4). The result is that the first control signal L2, R2 to reach the threshold voltage Vth switches on the corresponding transistor P3, P4. The latch circuit LT2 then receives the supply voltage Vcc via the transistors P11 and P3 or P4.

On FIG. 3C, the signal L2 is the first to reach the threshold voltage Vth, such that the control transistor P3 is the first to become on. As a result, the transistor P3 transfers the voltage Vcc to the inverter gate IG1, and the data signal L at the output node O1 begins to increase until it reaches the supply voltage Vcc, as shown in FIG. 3D. On FIG. 4C, the signal R2 is the first to reach the threshold voltage Vth, such that the control transistor P4 is the first to become on. As a result, the transistor P4 transfers the voltage Vcc to the inverter gate IG2, and the data signal R at the output node O2 begins to increase until it reaches the supply voltage Vcc, as shown in FIG. 4D. It shall be noted that the curves of the signals R2 are identical on FIGS. 3C and 4C. The same is true of the curves R1 and INR. Indeed, in the examples shown by FIGS. 3C and 4C, the input SI2 is coupled to the reference line BL2 the voltage of which does not change depending on the conductivity state of the memory cell to be read.

The end of the reading phase is controlled by the enabling signal SAEN going back up to Vcc. Thus, the transistors N10, N20 and N17, N27 become on. The result is that the stray capacitances of the bit BL1 and reference BL2 lines discharge. As a result, the signals INL and INR at the detection inputs SI1, SI2 gradually reach a zero voltage (FIGS. 3C, 4C). The voltages of the signals L1 and R1 follow those of the signals INL, INR. As the transistor P11 is off and the transistors N10, N20 are on, the source terminals of the transistors P3 and P4 are put to the high impedance state HZ, and the data signals L and R are put to zero. The latch circuit LT2 is thus reset.

Figure 5:
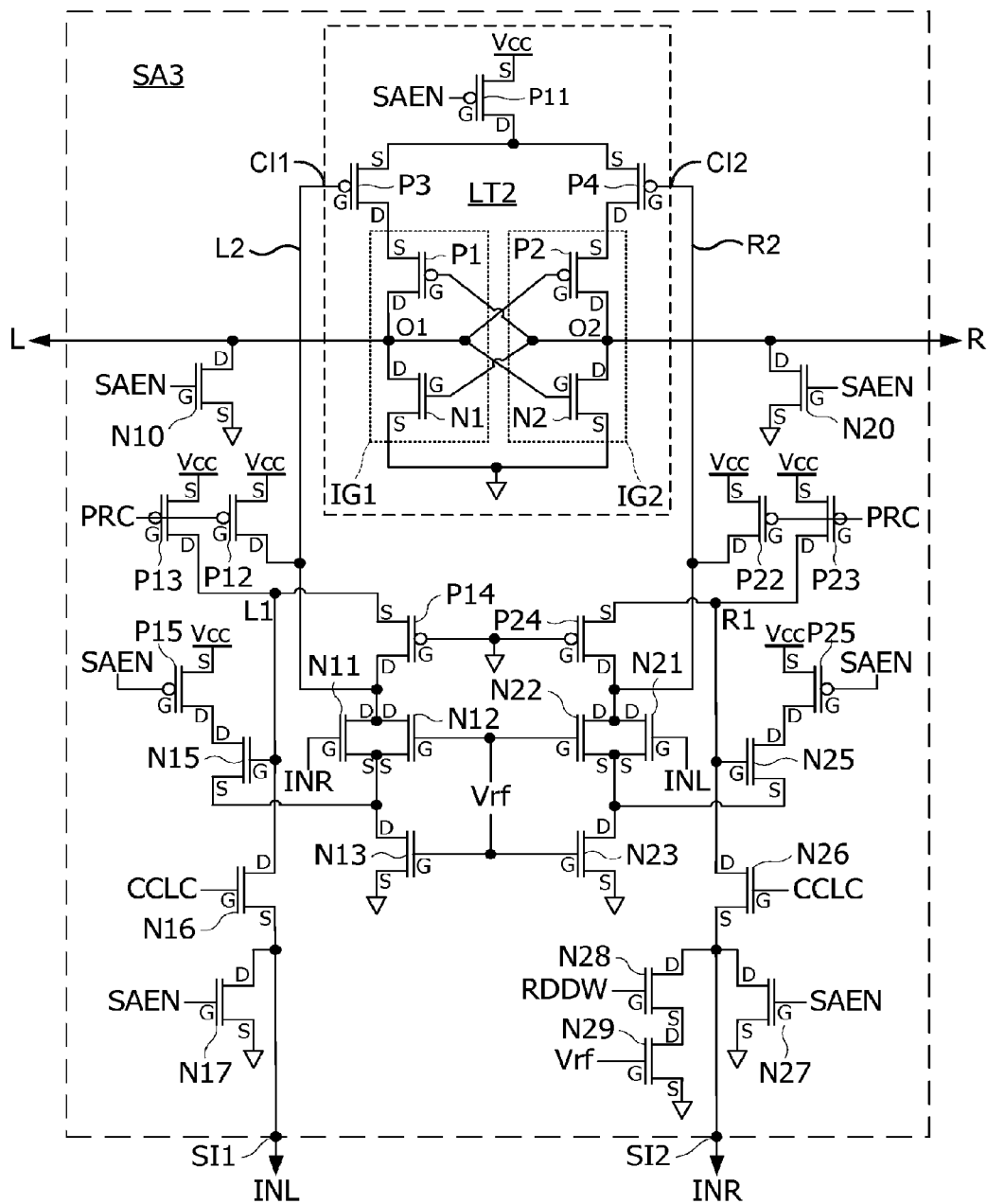
FIG. 5 schematically represents a differential sense amplifier, according to another embodiment.

FIG. 5 represents a sense amplifier SA3 according to another embodiment. The sense amplifier SA3 differs from the amplifier SA2 in that it comprises two additional N-channel transistors N11, N21 respectively mounted in parallel with the transistors N12 and N22. Thus, the drain terminals (D) of the transistors N11, N12 are connected to the source terminal of the transistor P14, and the source terminals (S) of the transistors N11, N12 are connected to the drain terminal of the transistor N13. Similarly, the drain terminals (D) of the transistors N21, N22 are connected to the source terminal of the transistor P24, and the source terminals (S) of the transistors N21, N22 are connected to the drain terminal of the transistor N23. The transistor N11 receives on its gate terminal (G) the signal INR at the detection input SI2, and the transistor N21 receives on its gate terminal (G) the signal INL at the detection input SI1. In this way, the control signal L2 is compared with the highest of the signals INR and Vrf to trigger the reset of the signal L2. Similarly, the control signal R2 is compared with the highest of the signals INL and Vrf to trigger the reset of the signal R2.

Indeed, in certain conditions, the signal Vrf can be lower than one and/or the other of the signals INL, INR at the end of the precharge phase. As the signals L2 and R2 decrease to reach and follow the signals INL and INR respectively, they may not reach the reference voltage Vrf. The transistors N12, N22 may thus not switch on, which prevents the corresponding control signal L2, R2 from being reset, and thus the latch circuit LT2 from switching. In the sense amplifier SA3, the control signal L2 is put to zero when it reaches the highest voltage of the signals INR or Vrf, and the control signal R2 is put to zero when it reaches the highest voltage of the signals INL and Vrf.

Furthermore, the current source CS enabling the reference line BL2 to be charged can be integrated into the sense amplifier SA3. Thus the amplifier SA3 may also comprise N-channel transistors N28, N29 mounted in series between the detection input SI2 and the ground. Thus, the transistor N28 has its drain terminal (D) connected to the detection input SI2, and its source terminal (S) connected to the drain terminal (D) of the transistor N29 the source terminal (S) of which is connected to the ground. The transistor N28 receives on its gate terminal (G) a control signal RDDW which can be equal to the supply voltage Vcc, and the transistor N29 receives on its gate terminal (G) the reference voltage Vrf.

FIGS. 6A to 6D and 7A to 7D represent timing diagrams of the signals SAEN, PRC, INL, INR, L1, L2, R1, R2, L and R in the sense amplifier SA3 during the precharge PRCH and reading RD phases. FIGS. 6A to 6D and 7A to 7D show the case in which the signal INL and/or the signal INR may reach a higher voltage than the reference voltage Vrf. FIGS. 6A, 6B and 6D are substantially identical to FIGS. 3A, 3B and 3D respectively, and FIGS. 7A, 7B and 7D are substantially identical to FIGS. 4A, 4B and 4D respectively. FIGS. 6A to 6D show the case in which the memory cell MC is in a high-conductivity state, and FIGS. 7A to 7D show the case in which the memory cell MC is in a low-conductivity state.

On FIG. 6C, the signal INR at the detection input SI2 has a higher voltage than the signal INL at the detection input SI1. The voltages of the signals L1, L2 decrease more rapidly than those of the signals R1, R2. The signal L2 is compared with the signal INR (having a higher voltage than the voltage Vrf), which enables its reset to be triggered more rapidly than if it were compared with the signal INL or the voltage Vrf. The signal R2 is reset to zero when it reaches the voltage Vrf.

On FIG. 7C, the signal INL has a higher voltage than the signal INR. The voltages of the signals R1, R2 decrease more rapidly than those of the signals L1, L2. The signal R2 is compared with the signal INL (having a higher voltage than the voltage Vrf), which enables its reset to be triggered more rapidly than if it were compared with the signal INR or the voltage Vrf. The signal L2 is not reset to zero since its voltage remains higher than that of the signal INR and than the voltage Vrf (the transistors N21, N22 remain off).

Figure 8:
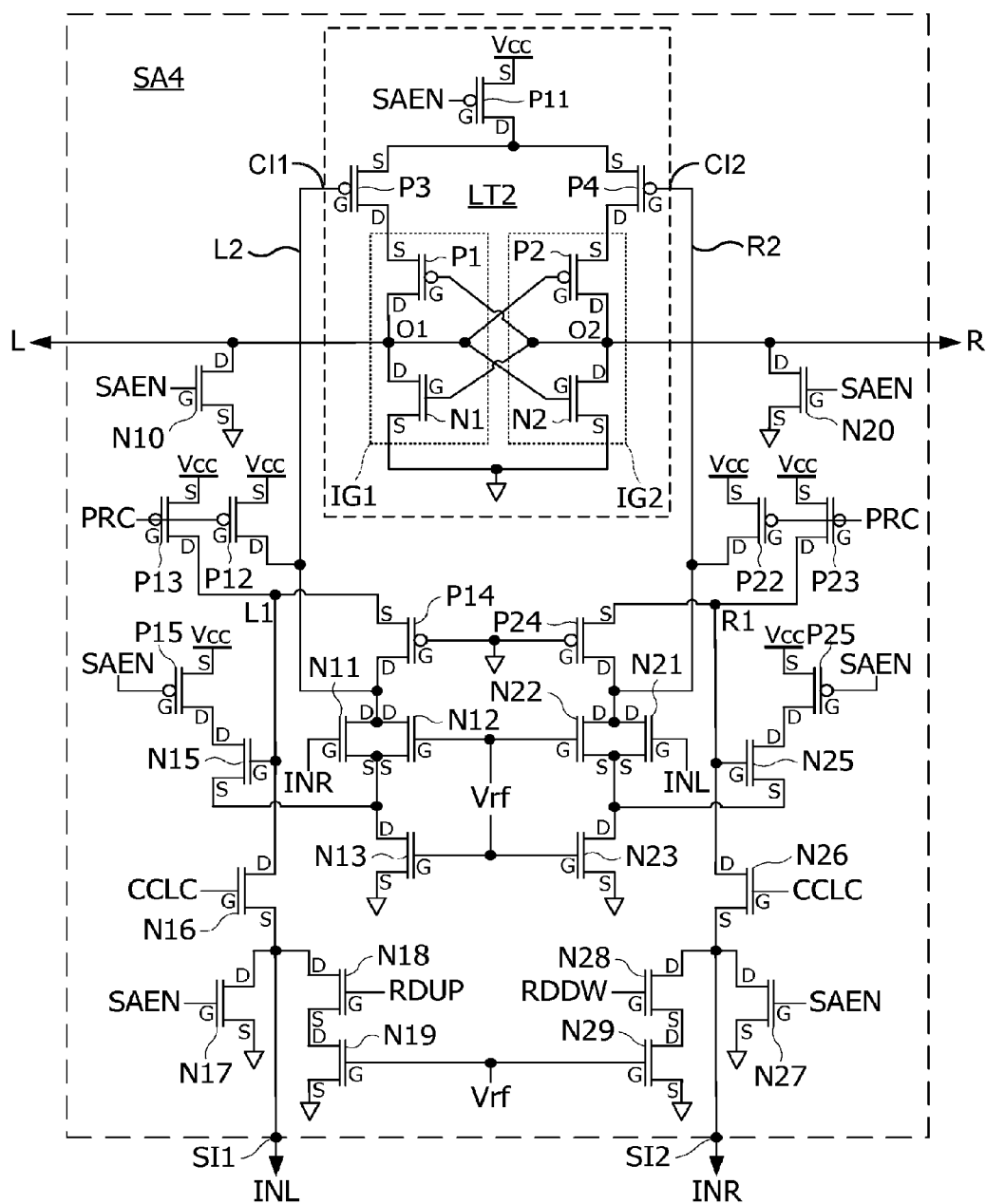
FIG. 8 schematically represents a differential sense amplifier, according to another embodiment.

FIG. 8 represents a sense amplifier SA4 according to another embodiment. The sense amplifier SA4 differs from the amplifier SA3 in that it has a symmetric architecture so as to be able to couple each of its detection inputs SI1, SI2 indifferently to a bit line connected to a memory cell to be read, and to a bit line used as reference line. Thus, the sense amplifier SA4 comprises N-channel transistors N18 and N19 mounted in series and the gate terminals (G) of which respectively receive a control signal RDUP and the reference voltage Vrf. Thus, the drain terminal (D) of the transistor N18 is connected to the detection input SI1, and the source terminal (S) of the transistor N18 is coupled to the ground through the transistor N19. The signals RDUP and RDDW are the opposite of one another: one is at the supply voltage Vcc while the other is at 0V depending on the detection input SI1, SI2 coupled to the memory cell to be read.

The sense amplifier SA4 may also comprise an output circuit OCT receiving the reading signals L and R and supplying identical signals L, R or inverted signals R, L depending on whether the memory cell to be read is coupled to the detection input SI1 or SI2. Thus, the circuit OCT can be controlled by one and/or the other of the signals RDUP and RDDW.

Figure 9:
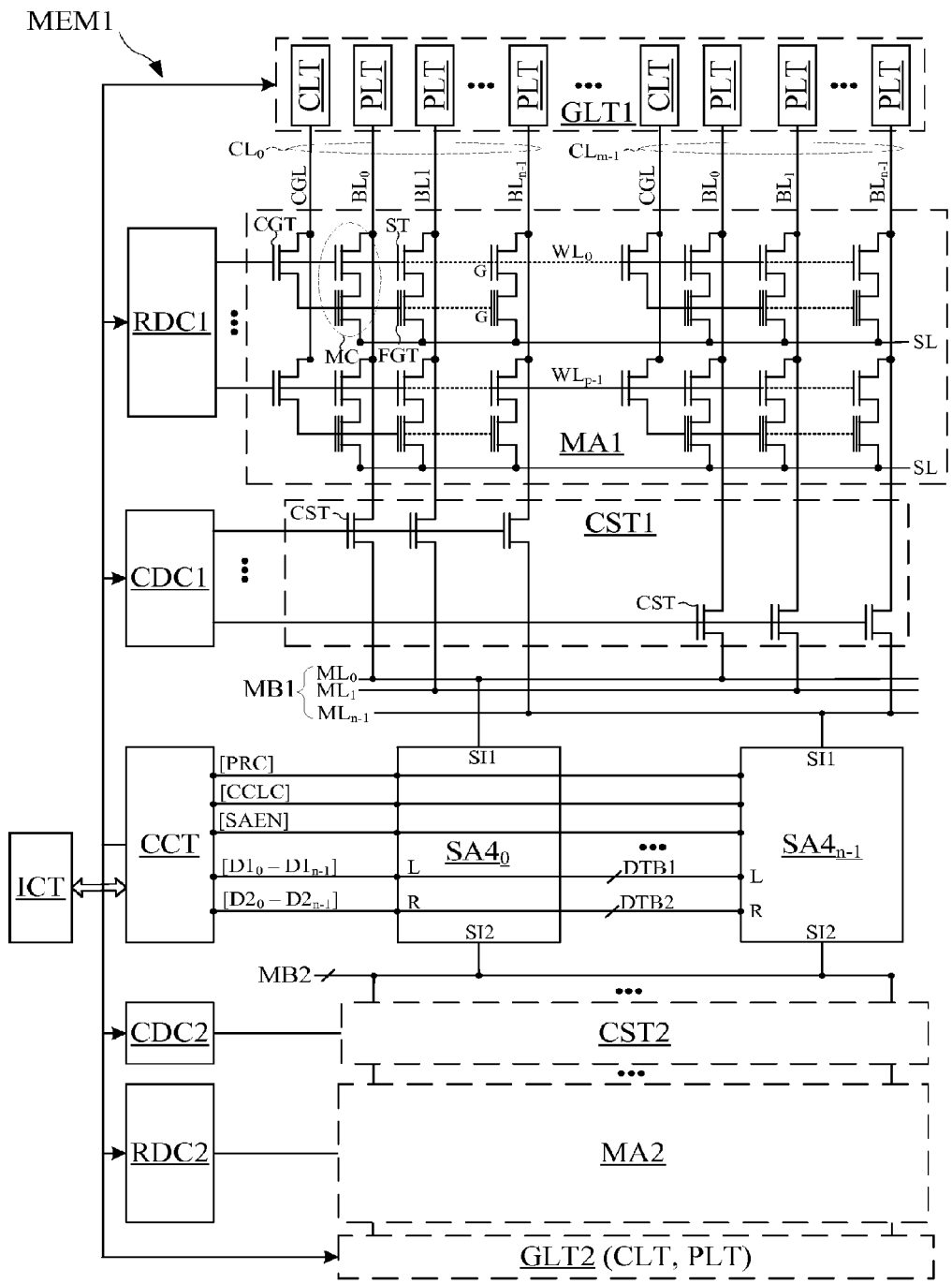
FIG. 9 schematically represents a memory device, comprising a sense amplifier according to one embodiment.

FIG. 9 shows an example of application in which a series of sense amplifiers such as the one represented in FIG. 8, is incorporated into an electrically erasable and programmable non-volatile memory device MEM1. The memory device MEM1 comprises two memory arrays MA1, MA2. The memory array MA2 has the same structure as the memory array MA1 and is represented in the form of a block. Each memory array MA1, MA2 comprises p word lines WL ($WL_0$-$WL_{p-1}$) and m columns CL ($CL_0$ to $CL_{m-1}$). Each column CL comprises n bit lines BL ($BL_0$-$BL_{n-1}$) and a control gate line CGL. Each memory array MA1, MA2 comprises m*n*p memory cells MC. In this example, the memory arrays MA1, MA2 are word-erasable and word-programmable, one word comprising memory cells of the same column connected to the same word line.

Each memory cell MC in a word comprises a select transistor ST and a floating-gate transistor FGT. The select transistor ST has its drain terminal (D) connected to a bit line BL, its source terminal (S) connected to the drain terminal (D) of the floating-gate transistor, and its gate terminal (G) connected to a word line WL. The floating-gate transistor FGT has its source terminal (S) connected to a source line SL and its gate terminal (G) connected to the source terminal (S) of a control gate transistor CGT. The control gate transistor CGT has its gate terminal (G) connected to the word line considered and its drain terminal (D) connected to the control gate line CGL of the column considered.

The memory device MEM1 further comprises a first and a second row decoder RDC1, RDC2, a first and a second column decoder CDC1, CDC2, a first and a second group GLT1, GLT2 of column latches CLT and programming latches PLT, a first and a second group CST1, CST2 of column select transistors CST, a first and a second multiplexing bus MB1, MB2, a row of n sense amplifiers SA4 ($SA4_0$-$SA4_{n-1}$), and a control circuit CCT such as a microprocessor, a microprogrammed sequencer, or a state machine receiving commands and data from outside and supplying responses and data to the outside through a communication interface circuit ICT.

The row decoder RDC1 supplies the word lines WL ($WL_0$-$WL_{p-1}$) of the memory array MA1 with row select signals and the row decoder RDC2 supplies the word lines of the memory array MA2 with row select signals. The column decoder CDC1 supplies the column select transistors CST of the group CST1 with column select signals and the column decoder CDC2 supplies the column select transistors of the group CST2 with column select signals.

The bit lines of the memory array MA1 belonging to different columns and having the same rank or the same weight (i.e., storing bits of the same rank of the different words) are coupled to the detection input SI1 of the same sense amplifier SA4 through the column select transistors CST of the group CST1 and the multiplexing bus MB1. In the same way, the bit lines of the memory array MA2 belonging to different columns and having the same rank or the same weight are coupled to the detection input SI2 of the same sense amplifier SA4 through the column select transistors of the group CST2 and the multiplexing bus MB2. For example, the bit lines $BL_0$ of the columns $CL_0$ to $CL_{m-1}$ are coupled to the sense amplifier $SA4_0$ through transistors CST and a line $ML_0$ of the multiplexing bus MB1. The bit lines $BL_{n-1}$ of the columns $CL_0$ to $CL_{m-1}$ are coupled to the sense amplifier $SA4_{n-1}$ through transistors CST and a line $ML_{n-1}$ of the multiplexing bus MB1.

The control circuit CCT supplies the sense amplifiers $SA4_0$-$SA4_{n-1}$ with the precharge signal PRC, the enabling signal SAEN, the cascode signal CCLC, and the signals RDDW and RDUP described above. The outputs L of the sense amplifiers $SA4_0$-$SA4_{n-1}$ are connected to different lines of a data bus DTB1 and the outputs R are connected to different lines of a data bus DTB2.

The steps of programming and erasing memory cells will not be described in detail and are performed by the control circuit CCT, which controls the decoders RDC1, RDC2, CDC1, CDC2 and supplies them with row and column addresses received through the interface ICT, and with control signals and a programming or erasing voltage Vpp. The control circuit CCT also supplies the programming latches PLT with data received through the interface ICT, and the column latches CLT are selected and enabled by the column select signals supplied by the column decoder CDC1 or CDC2. The erasing of a word comprises steps of applying the voltage Vpp onto the corresponding word line, through a row decoder RDC1 or RDC2, and applying the voltage Vpp onto the corresponding control gate line CGL via the corresponding column latch CLT while the corresponding source line is connected to the ground. The programming of the memory cells comprises steps of applying the voltage Vpp to the corresponding bit lines through the corresponding programming latches, applying the voltage Vpp to the corresponding word line, and connecting to the ground the corresponding control gate line CGL via the corresponding column latch.

A step of reading memory cells is performed by the control circuit CCT by means of the sense amplifiers SA4, and comprises precharging the bit lines and reading the data signal L (word $D1_0$-$D1_{n-1}$) or R (word $D2_0$ to $D2_{n-1}$) on the corresponding data bus DTB1 or DTB2. For example, to read memory cells in the memory array MA1, the control circuit CCT first selects the corresponding word line by means of the row decoder RDC1, and connects the n bit lines of the relevant column to the sense amplifiers $SA4_0$ to $SA4_{n-1}$ by means of the column decoder CDC1 and via the column select transistors CST of the group CST1. The circuit CCT then applies the precharge signal PRC, the cascode signal CCLC, the enabling signal SAEN, and the signals RDUP, RDDW in the manner described above to the sense amplifiers SA4, reads the data L on the data bus DTB1 (each sense amplifier supplies a bit of the word $D1_0$ to $D1_{n-1}$), then supplies them to the outside through the interface ICT.

It will be noted that this example of an embodiment of a memory device using sense amplifiers such as the sense amplifier SA2, SA3 or S4, has been described as a non-limitative example. Some embodiments of sense amplifiers can be implemented in various types of memory architectures, and can be used in any application in which the state of a memory cell can be determined by detecting a voltage drop on the terminals of the memory cell. The sense amplifiers SA2, SA3 or SA4 can also be used in memory devices not having a dual memory array as described above. In this case, the second detection input SI2 is connected to a reference line which is not coupled to bit lines of the memory array.

Figure 10:
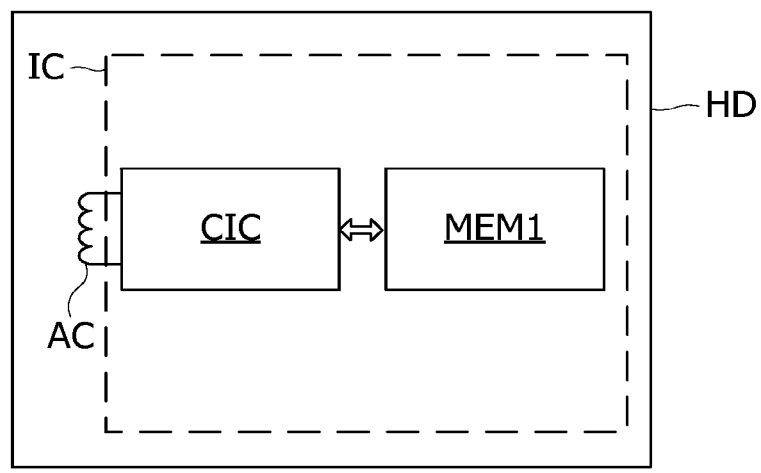
FIG. 10 schematically represents a portable device comprising a sense amplifier according to one embodiment.

A memory device comprising sense amplifiers is also susceptible of various embodiments and applications. For example, FIG. 10 schematically represents a portable device HD comprising an integrated circuit IC into which the memory MEM1 described above or any other type of non-volatile memory comprising sense amplifiers such as the sense amplifier SA2, SA3 or SA4 is integrated. According to one embodiment, the portable device HD may be a contactless smart card, a tag, a mobile phone, a PDA, etc., and may comprise a contactless communication interface circuit CIC to which the memory MEM1 is connected. The interface circuit CIC can be an NFC interface circuit (Near Field Communication) connected to an antenna coil AC, configured to exchange data by inductive coupling and load modulation, or can be a UHF interface circuit connected to a UHF antenna (not shown) and configured to exchange data by electric coupling and backscattering. The portable device HD can be configured to communicate with an external device such as a card or a contactless tag reader, a point of sale, another NFC mobile phone, etc. The memory MEM1 can be used both to store code (in particular application programs) and application data.

It will be understood by those skilled in the art that the present disclosure is susceptible of various alternative embodiments. In particular, the disclosure is not limited to a latch circuit comprising two inverter gates mounted head-to-tail. Indeed, the latch circuit can be produced in various other ways for example with flip-flops. Furthermore, means other than cascode transistors can be provided between the detection inputs and the gates of the control transistors to limit the voltages supplied to the bit lines.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A sense amplifier, comprising:
a first and a second detection input;
a latch circuit including a first section configured to supply a first data signal and a second section coupled to the first section and configured to supply a second data signal;
a P-channel first control transistor configured to electrically supply the first section with a first supply voltage, and having a gate terminal configured to receive a first control signal and linked to the first detection input;
a P-channel second control transistor configured to electrically supply the second section with a second supply voltage, and having a gate terminal configured to receive a second control signal and linked to the second detection input;
a first control circuit configured to reduce the first control signal to a sufficiently low voltage to put the first control transistor to an on state in response to the first control signal reaching a first reference voltage; and
a second control circuit configured to reduce the second control signal to a sufficiently low voltage to put the second control transistor to the on state in response to the second control signal reaching a second reference voltage, the latch circuit being configured to supply the first data signal in response to being activated by the first control transistor being in the on state and being configured to supply the second data signal in response to being activated by the second control transistor being in the on state.

2. The sense amplifier according to claim 1, wherein the first section of the latch circuit comprises a first inverter gate, and the second section of the latch circuit comprises a second inverter gate, the first and second inverter gates being mounted head-to-tail.

3. The sense amplifier according to claim 1, comprising a first cascode transistor arranged between the first detection input and the first control circuit, and a second cascode transistor arranged between the second detection input and the second control circuit.

4. The sense amplifier according to claim 1, wherein the first control circuit is configured to reduce a voltage of the first control signal when the first control signal is lower than a highest voltage among the first reference voltage and a voltage of the second detection input, and the second control circuit is configured to reduce a voltage of the second control signal when the second control signal is lower than a highest voltage among the second reference voltage and a voltage of the first detection input.

5. The sense amplifier according to claim 1, comprising a precharge circuit configure to put to a first voltage the gate terminals of the first and second control transistors, and to put to a second voltage the first and second detection inputs.

6. The sense amplifier according to claim 1, comprising a reset circuit configured to set the first and second data signals substantially to zero.

7. The sense amplifier according to claim 1, comprising an enabling switch coupled to respective conduction terminals of the first and second control transistors and configured to provide to the conduction terminals an enabling signal that is active during precharge and reading phases, and inactive from an end of the reading phase.

8. A memory device comprising:
a first memory array including first bit lines and memory cells electrically coupled to the first bit lines; and
a sense amplifier that includes:
a first detection input electrically coupled to at least one of the bit lines;
a second detection input;
a latch circuit including a first section configured to supply a first data signal and a second section coupled to the first section and configured to supply a second data signal;
a P-channel first control transistor configured to electrically supply the first section with a first supply voltage, and having a gate terminal configured to receive a first control signal and linked to the first detection input;
a P-channel second control transistor configured to electrically supply the second section with a second supply voltage, and having a gate terminal configured to receive a second control signal and linked to the second detection input;
a first control circuit configured to reduce the first control signal to a sufficiently low voltage to put the first control transistor to an on state in response to the first control signal reaching a first reference voltage; and
a second control circuit configured to reduce the second control signal to a sufficiently low voltage to put the second control transistor to the on state in response to the second control signal reaching a second reference voltage, the latch circuit being configured to supply the first data signal in response to being activated by the first control transistor being in the on state and being configured to supply the second data signal in response to being activated by the second control transistor being in the on state.

9. The memory device according to claim 8, comprising a second memory array including second bit lines, the second detection input of the sense amplifier being coupled to the second bit lines of the second memory array.

10. The memory device according to claim 9, wherein the sense amplifier comprises:
a first current source;
a first switch configured to couple the first current source to the first detection input when the second detection input is coupled to a first memory cell to be read, the first memory cell being part of the second memory array;
a second current source; and
a second switch configured to couple the second current source to the second detection input when the first detection input is coupled to a second memory cell to be read, the second memory cell being part of the first memory array.

11. The memory device according to claim 8, wherein the memory device is an integrated circuit on a semiconductor chip.

12. The memory device according to claim 8, wherein the sense amplifier includes a first cascode transistor arranged between the first detection input and the first control circuit, and a second cascode transistor arranged between the second detection input and the second control circuit.

13. The memory device according to claim 8, wherein the first control circuit is configured to reduce the voltage of the first control signal when the first control signal is lower than the highest voltage among the reference voltage and a voltage of the second detection input, and the second control circuit is configured to reduce the voltage of the second control signal when the second control signal is lower than the highest voltage among the reference voltage and a voltage of the first detection input.

14. The memory device according to claim 8, wherein the sense amplifier includes a reset circuit configured to set the first and second data signals substantially to zero.

15. The memory device according to claim 8, wherein the sense amplifier includes an enabling switch coupled to respective conduction terminals of the first and second control transistors and configured to provide to the conduction terminals an enabling signal that is active during precharge and reading phases, and inactive from an end of the reading phase.

16. A portable device comprising:
communication interface circuit; and
a memory device coupled to the communication interface circuit and including:
a first memory array including first bit lines and memory cells electrically coupled to the first bit lines; and
a sense amplifier that includes:
a first detection input electrically coupled to at least one of the bit lines;
a second detection input;
a latch circuit including a first section configured to supply a first data signal and a second section coupled to the first section and configured to supply a second data signal;
a P-channel first control transistor configured to electrically supply the first section with a first supply voltage, and having a gate terminal configured to receive a first control signal and linked to the first detection input;
a P-channel second control transistor configured to electrically supply the second section with a second supply voltage, and having a gate terminal configured to receive a second control signal and linked to the second detection input;
a first control circuit configured to reduce the first control signal to a sufficiently low voltage to put the first control transistor to an on state in response to the first control signal reaching a first reference voltage; and
a second control circuit configured to reduce the second control signal to a sufficiently low voltage to put the second control transistor to the on state in response to the second control signal reaching a second reference voltage, the latch circuit being configured to supply the first data signal in response to being activated by the first control transistor being in the on state and being configured to supply the second data signal in response to being activated by the second control transistor being in the on state.

17. The portable device according to claim 16, wherein the memory device includes a second memory array including second bit lines, the second detection input of the sense amplifier being coupled to the second bit lines of the second memory array.

18. The portable device according to claim 17, wherein the sense amplifier comprises:
a first current source;
a first switch configured to couple the first current source to the first detection input when the second detection input is coupled to a first memory cell to be read, the first memory cell being part of the second memory array;
a second current source; and
a second switch configured to couple the second current source to the second detection input when the first detection input is coupled to a second memory cell to be read, the first memory cell being part of the first memory array.

19. The portable device according to claim 16, wherein the sense amplifier includes a first cascode transistor arranged between the first detection input and the first control circuit, and a second cascode transistor arranged between the second detection input and the second control circuit.

20. The portable device according to claim 16, wherein the first control circuit is configured to reduce a voltage of the first control signal when the first control signal is lower than a highest voltage among the first reference voltage and a voltage of the second detection input, and the second control circuit is configured to reduce a voltage of the second control signal when the second control signal is lower than a highest voltage among second the reference voltage and a voltage of the first detection input.

21. The portable device according to claim 16, wherein the sense amplifier includes a reset circuit configured to set the first and second data signals substantially to zero.

22. The portable device according to claim 16, wherein the sense amplifier includes an enabling switch coupled to respective conduction terminals of the first and second control transistors and configured to provide to the conduction terminals an enabling signal that is active during precharge and reading phases, and inactive from an end of the reading phase.

23. A method for reading a memory cell, comprising:
electrically supplying a first section of a latch circuit through a first P-channel control transistor;
electrically supplying a second section of the latch circuit through a second P-channel control transistor;

coupling a first detection input to a bit line to which a memory cell to be read is coupled;

coupling a second detection input to a reference line;

reducing a first control signal for controlling the first P-channel control transistor to a sufficiently low voltage to put the first P-channel control transistor to an on state, in response to the first control signal reaching a first reference voltage, the first control signal being linked to the first detection input;

reducing a second control signal for controlling the second P-channel control transistor to a sufficiently low voltage to put the second P-channel control transistor to the on state, in response to the second control signal reaching a second reference voltage, the second control signal being linked to the second detection input;

supplying a first data signal by the first section of the latch circuit when the first P-channel control transistor is in the on state; and supplying a second data signal by the second section of the latch circuit when the second P-channel control transistor is in the on state.

24. The method according to claim 23, wherein:

reducing the first control signal to a sufficiently low voltage to put the first control transistor to the on state includes reducing the first control signal to a sufficiently low voltage to put the first P-channel control transistor to the on state when the first control signal reaches the highest voltage among the first reference voltage and a voltage of the second detection input, and reducing the second control signal to a sufficiently low voltage to put the second P-channel control transistor to the on state includes reducing the second control signal to a sufficiently low voltage to put the second control transistor to the on state when the second control signal reaches the highest voltage among the second reference voltage and a voltage of the first detection input.

25. The method according to claim 23, comprising precharging the sense amplifier by taking to a first voltage gate terminals of the first and second control transistors and taking to a second voltage the first and second detection inputs.

* * * * *